(12) United States Patent
Masson et al.

(10) Patent No.: US 6,337,647 B1
(45) Date of Patent: Jan. 8, 2002

(54) DIGITAL-ANALOG CURRENT CONVERTER

(75) Inventors: Thierry Masson, Varces; Isabelle Icord, Saint Egreve, both of (FR)

(73) Assignee: Atmel Grenoble SA, Saint Egreve (FR)

( * ) Notice: Subject to any disclaimer, the term of this patent is extended or adjusted under 35 U.S.C. 154(b) by 0 days.

(21) Appl. No.: 09/664,343

(22) Filed: Sep. 18, 2000

(30) Foreign Application Priority Data

Sep. 17, 1999 (FR) .............................................. 99 11666

(51) Int. Cl.⁷ ................................................ H03M 1/66
(52) U.S. Cl. ...................................... 341/150; 332/109
(58) Field of Search ................................. 341/150, 144, 341/166, 145, 147, 134, 135, 136, 152, 158; 332/109; 340/347 DA; 326/86

(56) References Cited

U.S. PATENT DOCUMENTS

| | | | |
|---|---|---|---|
| 4,404,546 A | * 9/1983 | Hata et al. | 340/347 DA |
| 4,999,630 A | 3/1991 | Masson | |
| 5,227,795 A | * 7/1993 | Yamakido et al. | 341/166 |
| 5,502,419 A | * 3/1996 | Kawasaki et al. | 332/109 |
| 5,570,313 A | 10/1996 | Masson et al. | |
| 5,977,796 A | * 11/1999 | Gabara | 326/86 |
| 6,040,742 A | * 3/2000 | Bailey et al. | 331/2 |

FOREIGN PATENT DOCUMENTS

JP  11-122112  4/1999

OTHER PUBLICATIONS

Patent Abstracts of Japan, vol. 17, No. 583, Oct. 22, 1993 and JP 5–175850 A, Jul. 13, 1993.

* cited by examiner

*Primary Examiner*—Brian Young
*Assistant Examiner*—John Nguyen
(74) *Attorney, Agent, or Firm*—Oblon, Spivak, McClelland, Maier & Neustadt, P.C.

(57) ABSTRACT

A digital-analog current converter receives, at input, a succession of bits of a binary signal and delivers, at output, sampled by a clock signal, a positive or negative current depending on the state of the input bit. The converter comprises at least one circuit to control the build-up time of the output current of the converter, comprising a capacitor and a circuit to charge this capacitor controlled by the clock signal. The build-up time is controlled by the charging of a capacitor at a constant current up to a reference voltage. The circuit to control the build-up time of the output current may comprise at least two reference voltages, the capacitor being charged and then discharged between these two voltages. The build-up time of the output current is then the sum of the time taken to charge the capacitor and the time taken to discharge the capacitor. The charging and discharging current of the capacitor can be sent directly into the output load of the converter by means of selector switches and current mirrors. Two capacitors are used and are they are charged and discharged. While one of the capacitors gets charged, the other gets discharged. The disclosure can be applied especially to sigma-delta type digital-analog converters.

8 Claims, 6 Drawing Sheets

DIGITAL-ANALOG CURRENT CONVERTER

BACKGROUND OF THE INVENTION

The present invention relates to a current digital-analog converter. It can be applied especially to digital-analog sigma-delta type converters.

The present development of technologies is tending to shift the boundary between digital technologies and analog technologies in order to reduce the analog part to the maximum extent. This trend is designed especially to simplify the hardware architecture of systems by performing most of the functions in digital techniques while at the same time reducing manufacturing costs. A major consequence of this development is the huge increase in the constraints carried over to the analog-digital or digital-analog conversion part, since ultimately the converter is at the end or almost at the end of the processing chain. The converters must therefore comply with increasingly demanding performance requirements.

With regard to digital-analog converters, there are several types. Among these different types, the sigma-delta type converters are of considerable interest since they work with only one conversion bit.

In sigma-delta type converters, the binary signal encoded on N bits and sampled at a given frequency Fs is converted by digital means into an over-sampled one-bit signal, namely a signal sampled at a far higher frequency F's= MxFs. This signal is then converted into an analog signal by means of a one-bit digital-analog converter and a lowpass filter placed at output of the converter.

There are many known ways of making this type of digital-analog converter. It is possible to make a voltage converter, i.e. a converter where either a positive voltage at a potential +Vref or a negative voltage at a potential –Vref is sent at output, depending on the state of the binary signal. This structure however is limited in particular to a distortion level of about 60 dB and is sensitive to the instabilities, generally known as "Jitter", in the reference clock. This jitter in particular prompts a parasite noise at the output of the converter.

Current converters are also made. In this case, either a positive current with a value +Iref or a negative current with a value –Iref is sent, depending on the state of the binary signal. These converters give very high distortion performance characteristics. However, they remain sensitive to the jitter of the clock.

There are also known ways of making switched-capacitor converters that are insensitive to the jitter of the clocks but they require very fast amplifiers to obtain efficient distortion performance levels.

An aim of the invention is to enable the making of a converter that ensures a high level of distortion and is insensitive to the jitter of the reference clock.

SUMMARY OF THE INVENTION

To this end, an object of the invention is a digital-analog current converter receiving, at input, a succession of bits of a binary signal and delivering, at output, sampled by a clock signal, a positive or negative current depending on the state of the input bit, wherein the converter comprises at least one circuit to control the build-up time of the output current of the converter, the build-up time being controlled by the charging of a capacitor by a constant current up to a reference voltage.

In a second embodiment, the circuit to control the build-up time of the output current comprises at least two reference voltages, the capacitor being charged and then discharged between these two voltages, the build-up time of the output current then being the sum of the time taken to charge the capacitor and the time taken to discharge the capacitor. An advantage of this embodiment is that it can be used to obtain high electrical efficiency.

In a third embodiment, the charging and discharging current of the capacitor is sent directly into the output load of the converter by means of selector switches and current mirrors. Two capacitors are used and are they are charged and discharged. While one of the capacitors gets charged, the other gets discharged. One advantage of this embodiment is that it can be used to overcome the current noise of the converter.

BRIEF DESCRIPTION OF THE DRAWINGS

Other features and advantages of the invention shall appear from the following description made with reference to the appended drawings, of which.

MORE DETAILED DESCRIPTION

Figure 1:
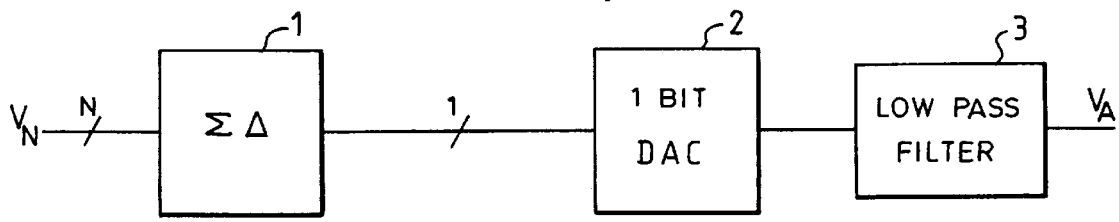
FIG. 1 is a block diagram of the digital-analog sigma-delta type converter.

FIG. 1 is a block diagram illustrating a sigma-delta type digital-analog conversion chain. This chain converts a digital signal $V_N$ encoded on N bits into an analog signal $V_A$. The signal $V_N$ is sampled at input of a sigma-delta converter 1 at a frequency Fs. This converter, whose mode of operation is well known, delivers a signal encoded on one bit that is over-sampled, i.e. the successive bits come out of the sigma-delta converter at a rate F's far greater than the input sampling frequency Fs, F's=MxFs. The output signal of the sigma-delta converter is then converted into an analog signal by means of a digital-analog converter 2 and then by a lowpass filter 3.

The working of a conversion chain of this kind can be described briefly. The parallel binary signal $V_N$ encoded on N bits is therefore converted by the sigma-delta converter 1 into a series signal conveyed on one bit. When the value of the input bit of the converter 2 is equal for example to 1, the converter delivers a voltage +Vref if it is a voltage type converter or a current +Iref if it is a current type converter. When the value of the bit is equal for example to 0, the converter delivers a voltage –Vref or $-I_{ref}$. This lowpass filter 3 placed at output of the digital-analog converter obtains a mean, in time, of the signals thus given by the converter. This mean is the result of the digital-analog conversion, namely the above-mentioned signal $V_A$.

Figure 2:
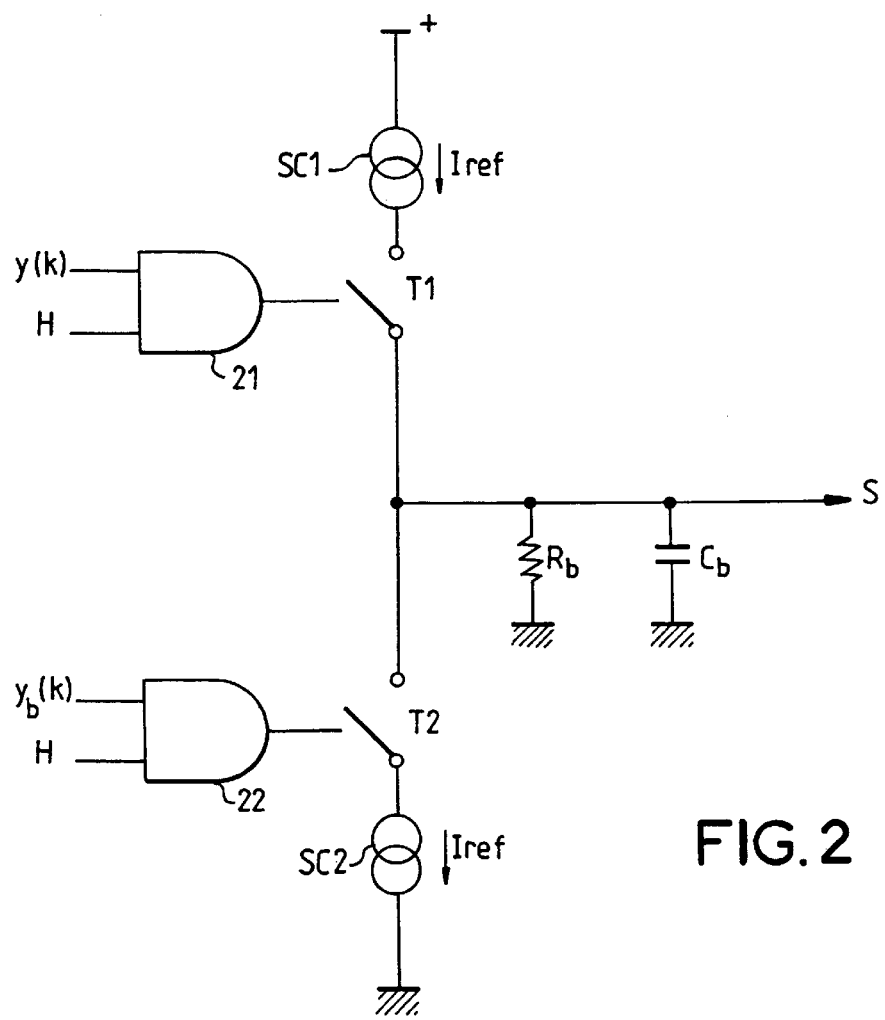
FIG. 2 is a block diagram of a digital-analog current converter.

FIG. 2 is a block diagram of a current digital-analog converter. At input, this converter receives a binary signal encoded on one bit. This signal is referenced y(k). This signal is given for example at output of a sigma-delta converter or any other conversion means for the conversion of an N bit parallel signal into a series signal. For example, the signal y(k) is successively the N bits y(0), . . . , y(k), . . . , y(N−1) of the parallel signal $V_N$ encoded on N parallel bits and to be converted into an analog value.

The converter illustrated by FIG. 2 has a first current source SC1 giving a current $I_{ref}$. This source is connected at input to a first supply terminal, for example a positive supply terminal. It is connected at output to a first switch T1 made out of a bipolar or MOS type transistor. The output of this first switch is connected to the input of a second switch T2 which too is based on a bipolar or MOS type transistor. The other terminal of the second switch is connected to a second current source SC2 furthermore connected to a second supply terminal at a potential below that of the first source SC1, for example the ground potential. The junction point of the two switches is connected to a lowpass filter, constituted for example by a resistor $R_b$ and a capacitor $C_b$ that are parallel-connected. The output S of the conversion chain is the junction point of the resistor and the capacitor, the other junction point of these elements being for example the ground potential. The first switch is controlled by the signal y(k) mentioned here above. It is not directly controlled by this signal but in combination with a clock signal H, the two signals being combined by a circuit 21 that performs a logic "and" operation between the two signals. The second switch is controlled by the conjugate signal $y_b(k)$ of the previous one, again in combination with the clock signal H, by means of a logic circuit 22 performing a logic "and" operation between the two signals. The output of the logic circuits 21, 22, possibly amplified, then control the bases or gates of switch transistor T1, T2 depending on whether they are bipolar or MOS type transistors.

The converter then works as follows. If the bit y(k) is equal to 1, a current or a voltage occurs at the base or gate of the transistor T1 which is controlled so as to open when the clock signal H is set up. The current $I_{ref}$ given by the first current source SC1 goes into a lowpass filter $R_b C_b$ through the transistor T1. At the same time, the bit $y_b(k)$ is at 0. The transistor T2, since it has no control current or voltage, remains off in the closed state. When the bit y(k) is equal to 0, the operation is reversed. The transistor T1 is off in the closed state and the transistor T2 is controlled in the open state. In this case, the current $I_{ref}$ of the second current source goes into the lowpass filter through the transistor T2 when the clock signal H is set up. Seen from the filter, the current $I_{ref}$ is then reversed. It therefore has a value $-I_{ref}$ instead of $+I_{ref}$ in the previous case.

A current converter of this kind, like a voltage converter, undergoes jitter from the clock H. To obtain both high distortion performance and clock insensitivity to jitter, the invention uses a digital-analog current converter to obtain a high distortion performance level and comprises means of time control during which the current is sent to the lowpass filter independently of the width of the clock signal H to overcome the jitter of this clock. This time is controlled by the charging or discharging of a capacitor with a constant current up to a reference voltage. The time is then equal to the time taken to discharge the capacitor. A limiting device known as a clamp blocks the voltage of the capacitor at the reference voltage.

Figure 3:
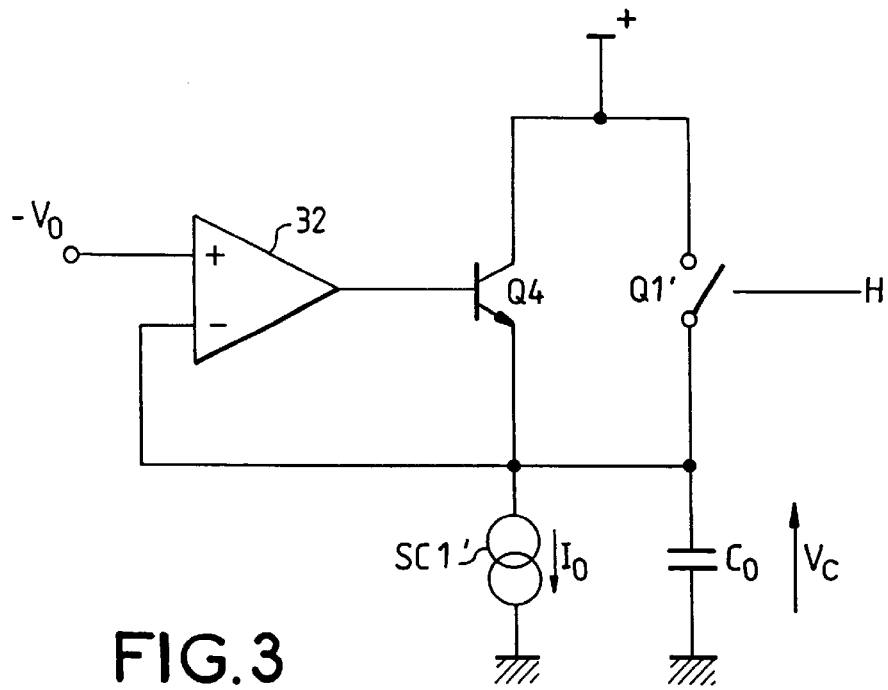
FIG. 3 is a first possible embodiment of a control circuit of the charging duration of the output filter in a converter according to the invention.

FIG. 3 shows a first possible embodiment of a circuit for controlling the time of current injection into the output filter, namely in fact a circuit to control the current build-up time at output of the converter $-I_{ref}$ or $+I_{ref}$. This circuit has a capacitor $C_0$ and a circuit for charging or discharging this capacitor. It therefore has a switch Q1 controlled by the clock signal H in such a way that Q1 is on when the clock signal is at 1 and off when the clock signal is at 0. An interface circuit controls the switch in current if it is a bipolar transistor or controls it in voltage if it is a MOS transistor by means of a clock signal H. The switch Q1 is connected between a positive supply terminal and a terminal of a current source SC1' that gives a constant current $I_0$, the other terminal of this source being connected to another supply terminal, for example the ground potential. A capacitor $C_0$, known as a clamp capacitor, is wired between, firstly, the junction point of the switch Q1 and the current source SC1' and, secondly, the ground potential. When this switch Q1 is on, namely when it is in the presence of the clock signal H, the current $I_0$ goes into the switch Q1. When this switch Q1 is off, the current $I_0$ charges the capacitor $C_0$. The voltage Vc at the terminals of this capacitor then decreases from a zero value as shown in FIG. 4.

Figure 4:
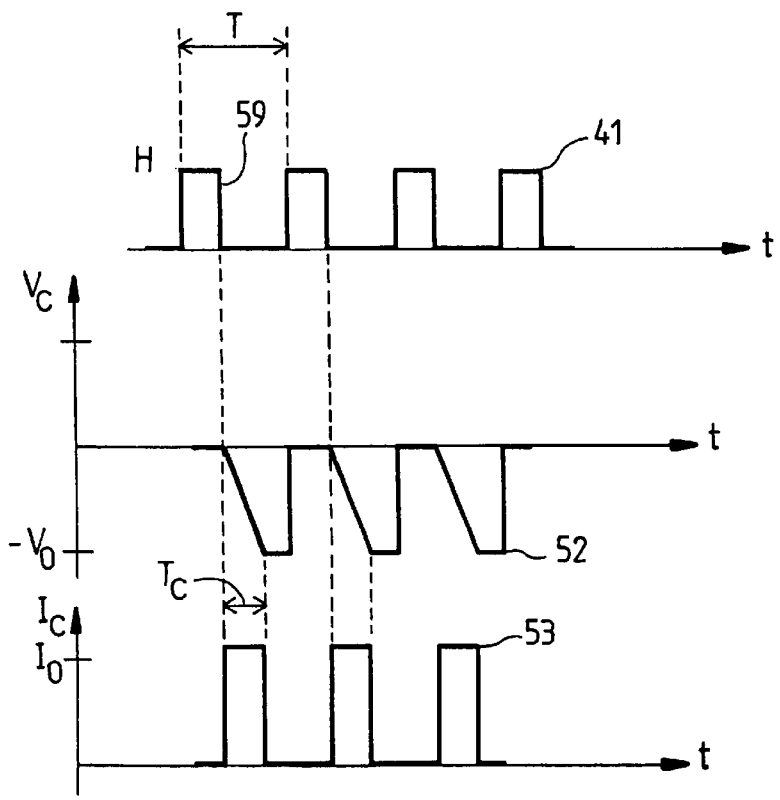
FIG. 4 illustrates signals in play as a function of time and as a function of the clock signal in the above-mentioned circuit.

FIG. 4 illustrates the different signals in play as a function of the time t and as a function of the clock signal H. This signal is a binary signal illustrated by a curve 41. The second curve 52 represents the voltage Vc at the terminals of the capacitor $C_0$. On the leading edge 59 of the clock signal, the capacitor starts getting charged at constant current $-I_0$, from the voltage 0. It thus gets charged until its voltage reaches a value $-V_0$ known as the clamp voltage.

Indeed, a circuit limits the voltage Vc to a minimum value $-V_0$ which is the reference voltage. This circuit has an operational amplifier 32 whose positive input is connected to a potential with a value $-V_0$ and whose negative input is connected to the emitter of a PNP transistor Q4, this emitter being connected to the junction point of the current source, the capacitor $C_0$ and the switch Q1. The base of the transistor Q4 is controlled by the output of the operational amplifier 32 and its collector is connected to the positive supply terminal. When the voltage Vc reaches the value known as the clamp value of $-V_0$, the output of the operational amplifier delivers a positive voltage that controls the transistor Q4 in the on state, this transistor being previously off. The current $I_0$ is then deflected by Q4, the capacitor then remaining charged at the voltage value $-V_0$, which is illustrated by a second curve 52 in FIG. 4. When the switch Q1 becomes on, the voltage Vc again becomes equal to the voltage at the terminals of the current source SC1', namely substantially zero.

A third curve 53 illustrates the charging current $I_0$ of the capacitor as a function of the time t. The build-up time of this current is perfectly controlled by the charging duration of the capacitor $C_0$ illustrated by the progress of the voltage between 0 and −Vc. This duration is independent of the jitter of the clock H and may thus be used to control the switches T1, T2 of the converter, like that of FIG. 2 for example. For this purpose, it is planned to have a shaping circuit that creates a logic signal whose duration is equal to the charging time of the capacitor $C_0$. This signal then controls the switches T1, T2 in combination with the signals y(k) and $y_b(k)$ to replace the clock signal H itself. Other means may be planned to obtain the width of output current of the converter $I_{ref}$ equal to the discharge time of the capacitor $C_0$.

The exemplary embodiment of a circuit to control the build-up time of the output current of the converter works on the basis of the discharge time of the capacitor $C_0$. It is of course possible to obtain a device of this kind through the charging of the capacitor $C_0$. In either case, the sign of the current $I_0$ in the capacitor changes.

The time $T_{on}$ during which the transistors T1, T2 are controlled, which is also the discharge time of the capacitor $C_0$, is given by the following relationship:

$$T_{on} = \frac{C_0 V_0}{I_0} \qquad (1)$$

The charge injected into the output filter $R_b C_b$ during a clock period T is:

$$Q = \frac{I_{ref} V_{ref} C_0}{I_0} \qquad (2)$$

The efficiency is relatively low because the charging of the output filter is done only during the period Tc for charging the capacitor $C_0$ which may be low as compared with the period T. Tc for example may be in the range of T/4.

Figure 5:
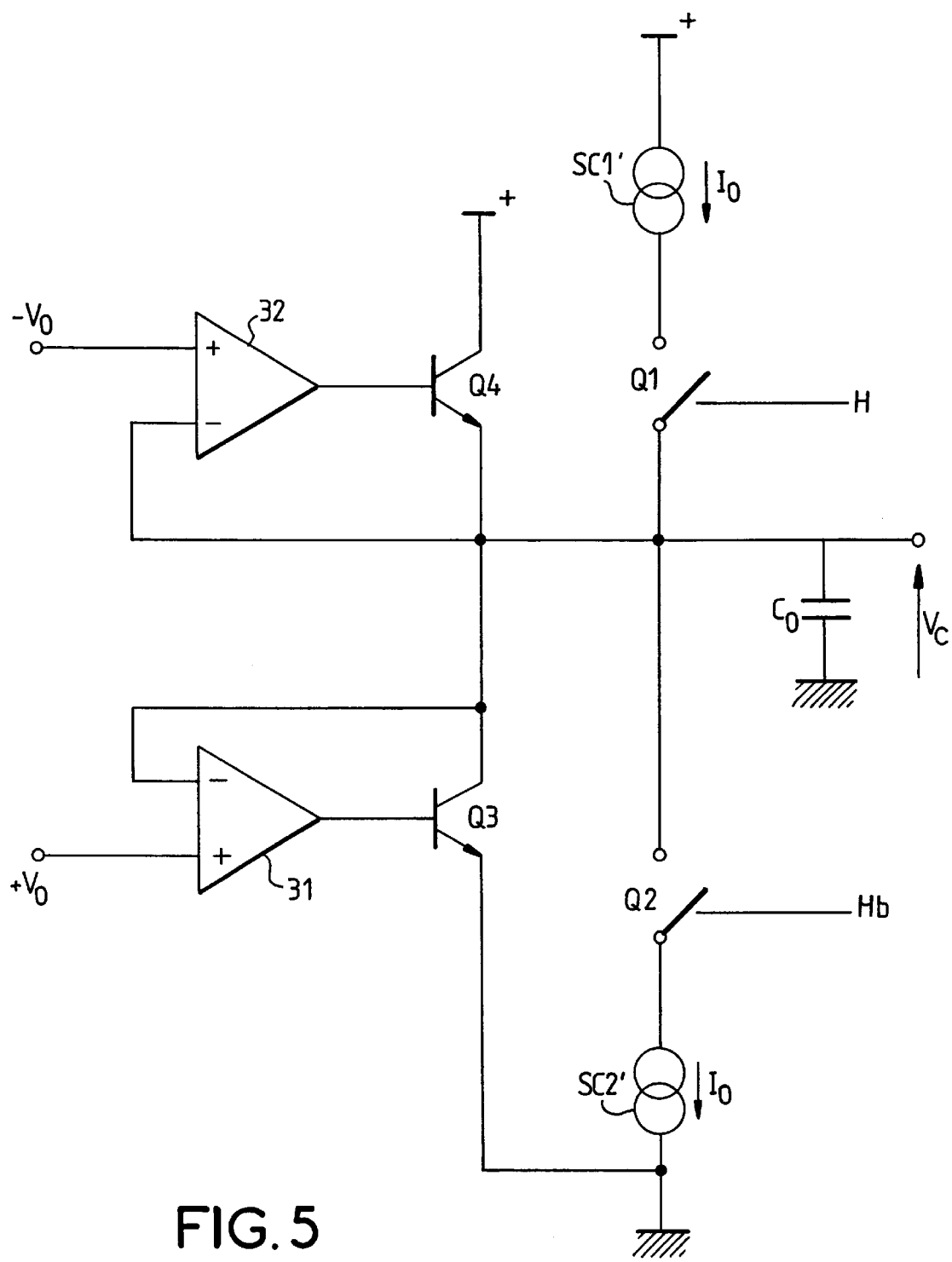
FIG. 5 is a second possible embodiment of a circuit to control the duration of charging the output filter in a converter according to the invention.

FIG. 5 illustrates a second possible embodiment of a circuit to control the injection time of the current, which improves the efficiency. In this embodiment, two reference voltage values are used and the capacitor is charged and discharged between these two voltages also known as clamp voltages. The time during which the converter sends the current $I_{ref}$ at output, into the load, is then the sum of the time taken to charge the capacitor and the time taken to discharge the capacitor. The current $I_{ref}$ of the converter can furthermore be divided by two as compared with the above cases with the same packet of charges sent at output.

The circuit comprises a charging and discharging circuit of the capacitor $C_0$ with two reference voltages. It therefore has, in series, a first current source SC1' connected to a supply terminal, a first switch Q1, a second switch Q2 and a second current source SC2' connected to a second supply terminal, for example the ground potential. The switches are for example bipolar transistors or MOS type transistors. The two current sources deliver a current $I_0$. The first switch Q1 is controlled by the clock signal H and the second switch Q2 is controlled by the conjugate of the clock signal $H_b$. A capacitor $C_0$ is connected between the junction point of the two switches Q1, Q2. The signal EN present at this capacitor $C_0$ replaces the signal H combined with the bits y(k), $y_b$(k) at input of the converter as illustrated by FIG. 2.

When the clock signal H is at 1, namely when it is present, the capacitor $C_0$ gets charged at constant current $I_0$. Indeed, in this case, the transistor Q1 is on and the transistor Q2 is off. The voltage Vc at the terminals of the capacitor $C_0$ therefore increases linearly. When the clock signal H is at 0, the signal $H_b$ is at 1 and the capacitor gets discharged at constant current $I_0$ through the second switch Q2. The voltage Vc at the terminals of the capacitor therefore decreases linearly. Two circuits limit this voltage Vc, one to a maximum value $V_0$ and the other to a minimum value $-V_0$. The $V_0$ limiting circuit is constituted for example by an operational amplifier 31 and a PNP bipolar transistor Q3. The positive input of the operational amplifier 31 receives the voltage $V_0$ and its negative input is connected to the emitter of the transistor Q3 which is furthermore connected to the junction point of the two switches Q1, Q2. The output of the operational amplifier controls the base of the transistor Q3 whose source is connected to the second supply terminal, for example the ground potential. When the voltage Vc at the terminals of the capacitor $C_0$, which is also the voltage present at the negative input of the operational amplifier, reaches the value $V_0$, the output of the amplifier gives a base current to the transistor Q3 which then shunts the current $I_0$ that continues to be given by the first source SC1' through the switch Q1 during the remaining time when the clock H is in the 1 state. The $-V_0$ limiting circuit is for example formed by an operational amplifier 32 and an NPN bipolar transistor Q4. The positive input of the operational amplifier 32 receives the voltage $-V_0$ and its negative input is connected to the emitter of the transistor Q4 which is furthermore connected to the junction point of the two switches Q1, Q2. The output of the operational amplifier controls the base of the transistor Q4 whose collector is connected to the first supply terminal which is the positive supply terminal. When the voltage Vc at the terminals of the capacitor $C_0$, which is also the voltage present at the negative input of the operational amplifier, reaches the value $-V_0$, the output of the amplifier gives a base current to the transistor Q4 which then shunts the current $I_0$ that continues to be given by the second source SC2' through the switch Q2 during the remainder of the time when the clock H is in the 0 state.

Figure 6:
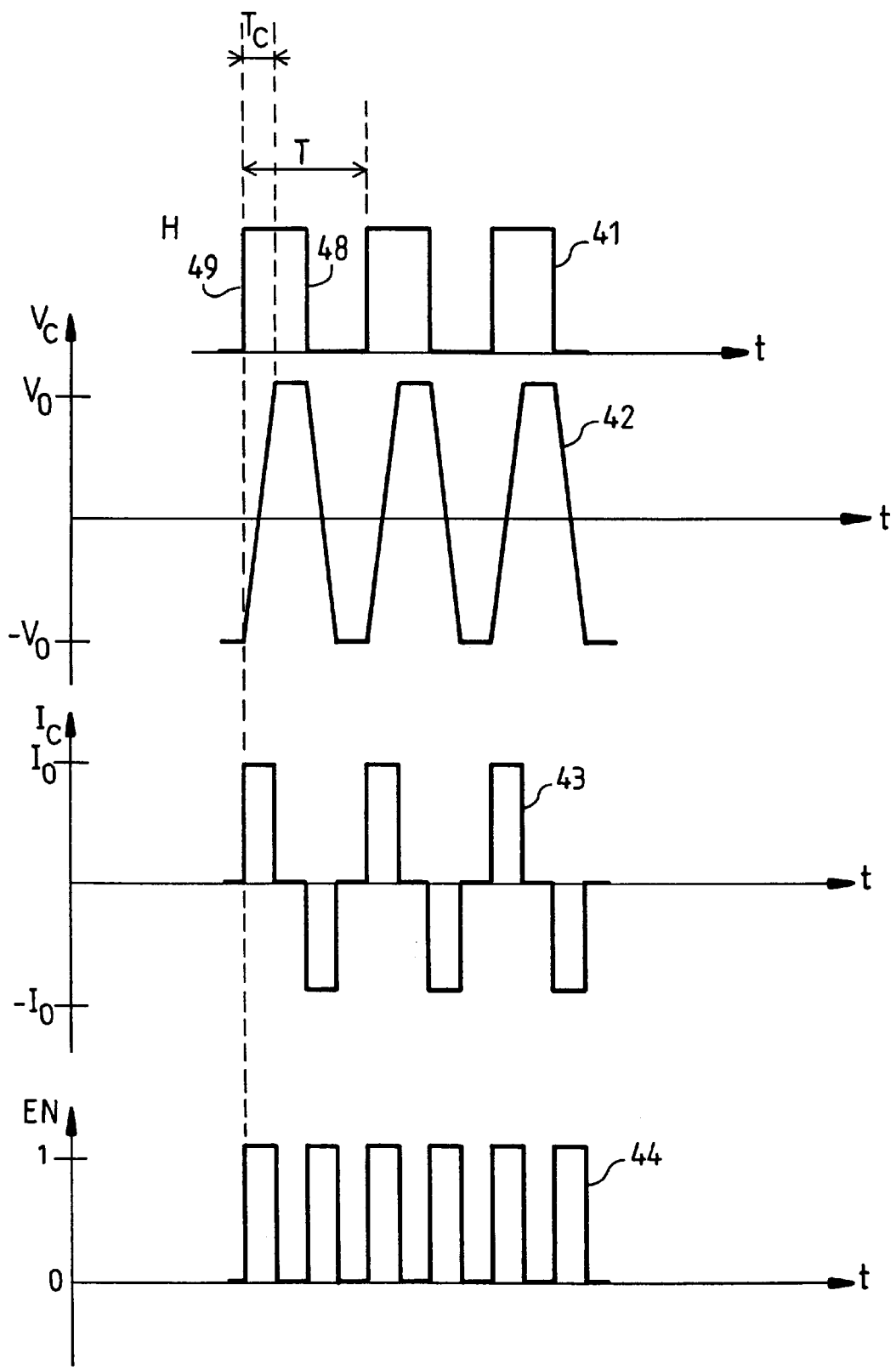
FIG. 6 illustrates signals in play as a function of the time t and as a function of the clock signal in the above-mentioned circuit.

FIG. 6 illustrates the different signals in play as a function of the time t and as a function of the clock signal H. The latter signal is a binary signal illustrated by a curve 41. A second curve 42 represents the voltage Vc at the terminals of the capacitor $C_0$. On the leading edge 49 of the clock signal, the capacitor begins to get charged at a constant current $I_0$, from the voltage $-V_0$. It gets charged until its voltages reaches the value $V_0$. The voltage Vc remains clipped at $V_0$ for the rest of the time when the clock signal is in the 1 state. During the time Tc for the charging of the capacitor, the charging current of this capacitor is $I_0$. This current is zero for the rest of the clock signal H.

On the trailing edge 48 of the clock signal H or on the leading edge of its conjugate signal $H_b$, the capacitor starts getting discharged at constant current $I_0$ from the voltage $V_0$. It gets discharged until its voltage reaches the value $-V_0$. The voltage Vc remains at $-V_0$ for the rest of the time when the clock signal is in the 0 state. During the time Tc for charging the capacitor, the charging current of this capacitor is $-I_0$. This current is zero once the value $-V_0$ is reached. A curve 43 illustrates the shape of the current $I_0$.

A binary signal EN can be created by known means from the voltage Vc at the terminals of the capacitor $C_0$. The width of this signal is equal to the width of the build-up time of the voltage Vc. In other words, at each build-up of the voltage Vc, the signal EN is equal to 1 and outside it is equal to 0. It is the signal EN that is combined with the bits y(k) and $y_b$(k) at input of the converter as illustrated for example by FIG. 2, instead of the clock signal H. As the case may be, the signal EN may also be equal to 1 during the drop in the voltage Vc.

The duration $T_{on}$ for charging the capacitor $C_0$ is given by the following relationship:

$$T_{on} = \frac{2C_0 V_0}{I_0} \qquad (3)$$

This time is also the time when the switches T1, T2 of the converter are controlled. It is independent of the jitter of the clock H.

The charge Q injected during a clock period T is:

$$Q = \frac{2I_{ref}V_{ref}C_0}{I_0} \quad (4)$$

The efficiency is therefore improved as compared with a circuit of the type shown in FIG. 3.

With regard to the noise of the converter which is a function of the variation in charge dQ injected into the output filter $R_b$, $C_b$ of the conversion chain, it is substantially zero. For the standard converter, the charge Q injected is given by the following relationship:

$$Q=(I_{ref}+dI_{ref})\times(T+dT) \quad (5)$$

where T represents the time taken to charge the capacitor $C_b$ of the filter at output of the converter.

The variation in charge dQ is therefore given by the following relationship:

$$dQ=dI_{ref}\times T+I_{ref}\times dT \quad (6)$$

In one converter according to the invention, T is perfectly controlled and equal to $T_{on}$, therefore dT=0. The remaining noise is only due to the current noise $dI_{ref}$.

Figure 7:
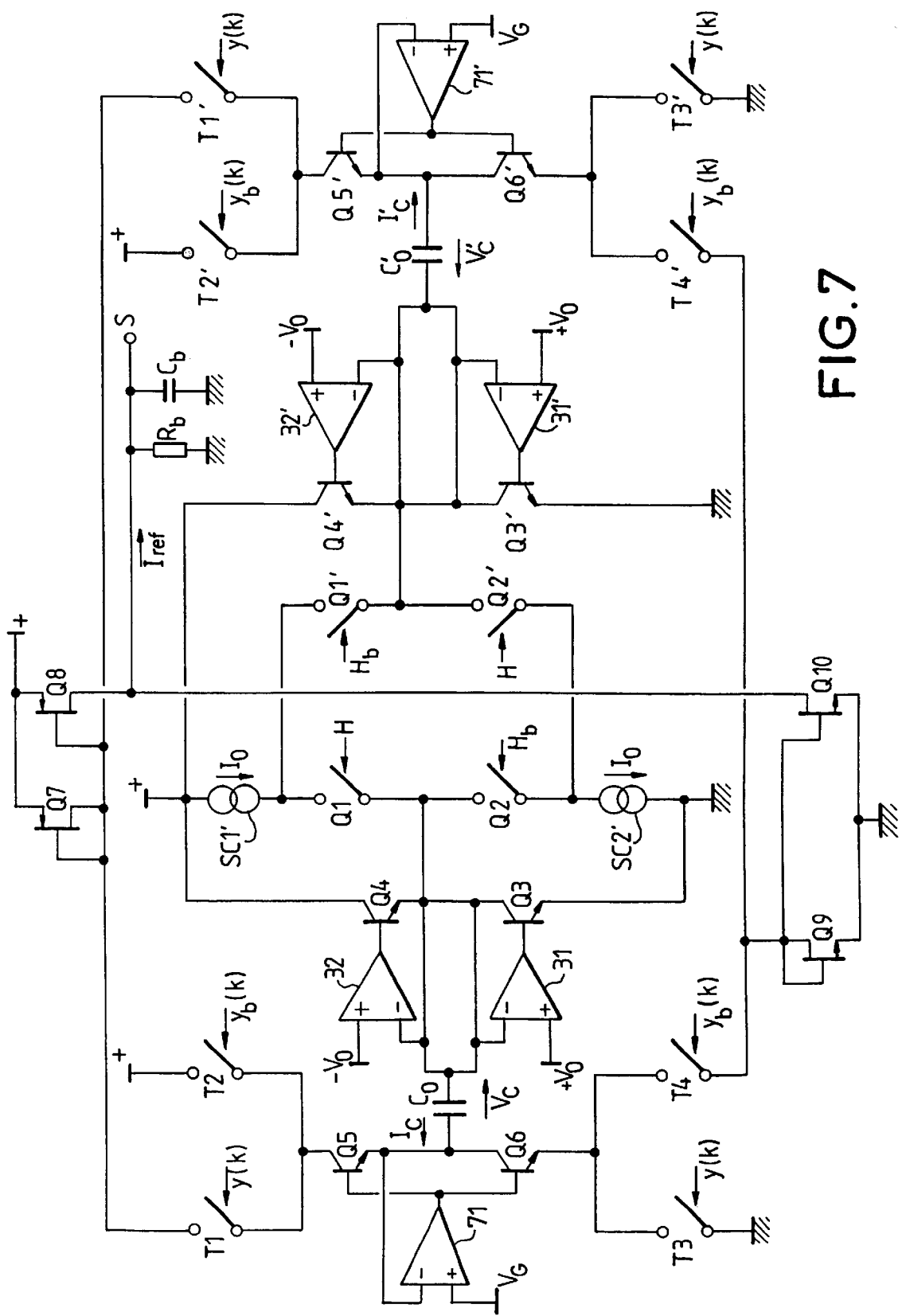
FIG. 7 is another possible embodiment of a converter according to the invention.

FIG. 7 shows another possible embodiment of a converter according to the invention. In this embodiment, the charging and discharging current of the clamp capacitor $C_0$ is sent directly into the output load, namely into the output filter $R_bC_b$, by means of switches and current mirrors. Then, two control circuits of the type shown in FIG. 5, cabled in differential mode, are used. This is known as the differential double clamp method. These two circuits are used with two clamp capacitors that are charged and discharged.

While one of the capacitors gets charged, the other gets discharged. One advantage of this embodiment is that it can be used to overcome the current noise $dI_{ref}$ of the converter.

The current charging time control circuit therefore has a pair of differential circuits. More specifically, it has two parallel arms each with a capacitor and a circuit for charging and discharging this capacitor at constant current of the type shown in FIG. 5 but controlled in phase opposition. The current sources SC1', SC2' are for example common to the two circuits.

Thus, since the first circuit is identical to that of FIG. 5, the second circuit comprises, in series with the first current circuit SC1', a first switch Q1'. A second switch Q2' is series-connected with the second current source SC2'. The switches are for example bipolar transistors or MOS type transistors. The first switch Q1' is controlled by the conjugate clock signal $H_b$ while the switch Q1 is controlled by the clock signal H. Similarly, the second switch Q2' is controlled by the clock signal H while the switch Q2 is controlled by the clock signal $H_b$. In this sense, the two circuits of the differential pair are controlled in phase opposition by means of the clock signal H. A capacitor C'$_0$ is connected between the junction point of the two switches Q1', Q2'. This capacitor C'$_0$ is for example equal in value to the capacitor $C_0$ of the first circuit.

Two circuits limit the voltage Vc at the terminals of the capacitor C'$_0$, one to a maximum value $V_0$ and the other to a minimum value $-V_0$. The $V_0$ limiting circuit is constituted for example by an operational amplifier 31' and a PNP bipolar transistor Q3'. The positive input of the operational amplifier 31' receives the voltage $V_0$ and its negative input is connected to the emitter of the transistor Q3' which is furthermore connected to the junction point of the two switches Q1', Q2'. The output of the operational amplifier controls the base of the transistor Q3' whose source is connected to the second supply terminal, for example the ground potential. When the voltage Vc at the terminals of the capacitor C'$_0$, which is also the voltage present at the negative input of the operational amplifier, reaches the value $V_0$, the output of the amplifier gives a base current to the transistor Q3' which then shunts the current $I_0$ that continues to be given by the first source SC1' through the switch Q1' during the remaining time when the clock H is in the 1 state. The $-V_0$ limiting circuit is for example formed by an operational amplifier 32' and an NPN bipolar transistor Q4'. The positive input of the operational amplifier 32' receives the voltage $-V_0$ and its negative input is connected to the emitter of the transistor Q4' which is furthermore connected to the junction point of the two switches Q1', Q2'. The output of the operational amplifier controls the base of the transistor Q4' whose collector is connected to the first supply terminal which is the positive supply terminal. When the voltage V'c at the terminals of the capacitor C'$_0$, which is also the voltage present at the negative input of the operational amplifier, reaches the value $-V_0$, the output of the amplifier gives a base current to the transistor Q4' which then shunts the current $I_0$ that continues to be given by the second source SC2' through the switch Q2' during the remainder of the time when the clock H is in the 0 state.

The two clamp capacitors $C_0$, C'$_0$ are each connected to a virtual ground potential. In other words, the terminal of the capacitor $C_0$ or C'$_0$ not connected to the junction point of the switches Q1, Q2 or Q1; Q2' is connected to a potential that is automatically linked to the value of 0 volts. The function of this automatically controlled potential will be explained further below in the description.

Figure 8:
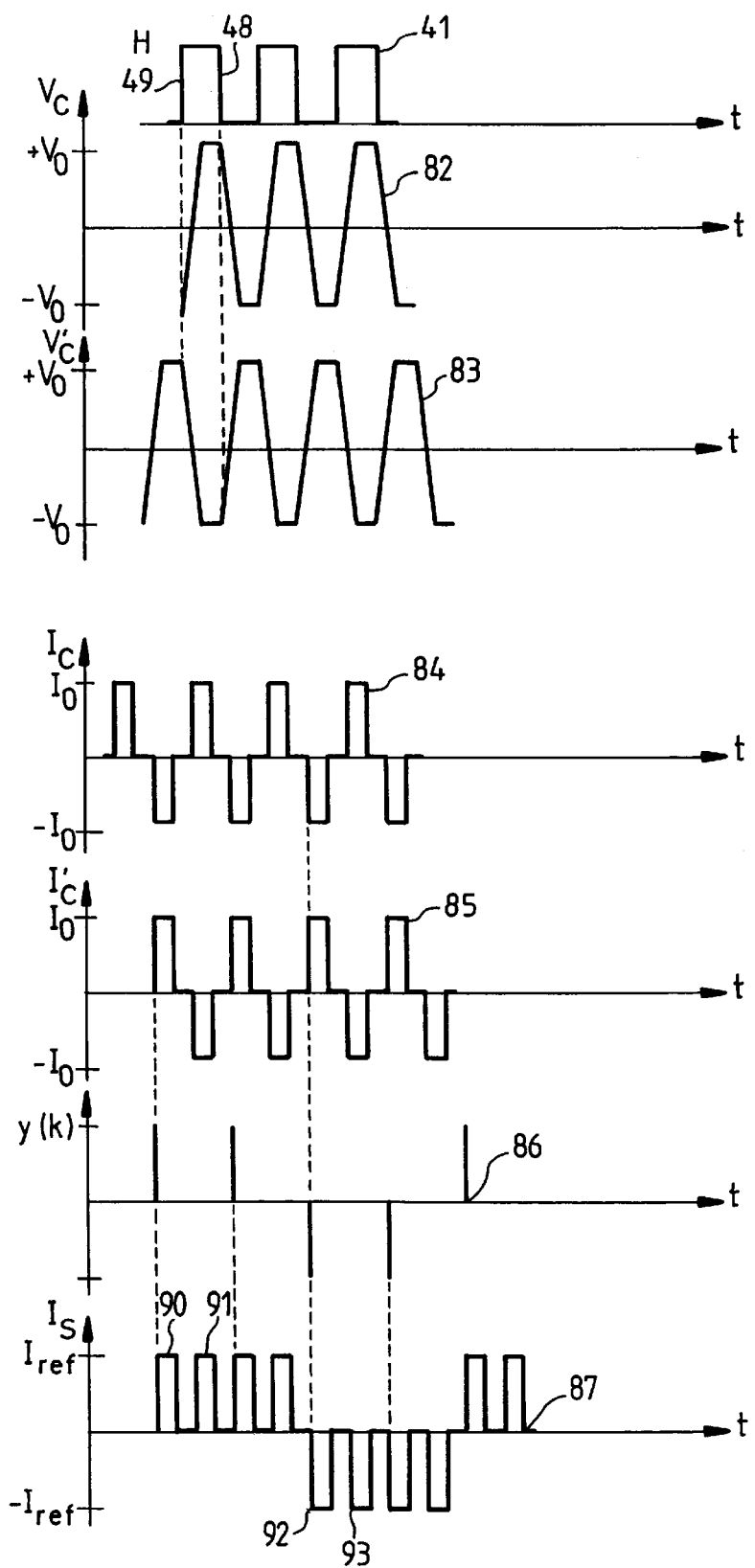
FIG. 8 illustrates signals in play as a function of the time t and as a function of the clock signal in the above-mentioned circuit, bringing into play especially the shape of the current for charging the output filter.

Since the two circuits of the differential pair are controlled in phase opposition as indicated here above, when the capacitor $C_0$ of the first circuit gets charged, the capacitor C'$_0$ of the second circuit gets discharged. FIG. 8 illustrates this situation. Like the FIGS. 4 and 6, this figure illustrates different signals in play as a function of the time t and as a function of the clock signal H. A first curve 41 again illustrates the shape of the clock signal H as a function of the time t. A second curve 82 illustrates the shape of the voltage Vc at the terminals of the capacitor $C_0$ and a third curve illustrates the shape of the voltage V'c at the terminals of the capacitor C'$_0$. Whereas the capacitor $C_0$ gets charged from the leading edge 49 of the clock signal, the capacitor C'$_0$ gets discharged. The situation is reversed starting with the trailing edge 48 of the clock signal H.

A fourth curve 84 illustrates the current Ic in the capacitor $C_0$ and a fifth curve 85 illustrates the current I'c in the capacitor C'$_0$. The two currents are in phase opposition. When the capacitor $C_0$ gets charged, its current Ic is equal to $I_0$ and the current I'c which goes into the capacitor C'$_0$ which gets discharged is then $-I_0$, and vice versa. The current Ic corresponds to the current Ic of FIG. 6, namely the charging current of the capacitor $C_0$ of FIG. 5.

The output filter $R_bC_b$ is still supplied with the current $I_{ref}$, the output S of the filter being the output of the conversion chain, in practice the output of the digital-analog converter. In the exemplary embodiment shown in FIG. 7, the output current $I_{ref}$ is the current for charging and discharging the capacitors $C_0$, C'$_0$. The time taken for the charging of the filter by the current $I_{ref}$ or $-I_{ref}$ is therefore perfectly defined by the control of the charging duration of the capacitors $C_0$, C'$_0$. The charging and discharging current of the capacitors is for example sent to the output filter by means of switches and current mirrors, in passing through the potential point automatically linked to a virtual ground.

The circuit used to bring the potential to 0 has for example an operational amplifier 71, 71' whose positive terminal is connected to a potential $V_G$ equal to 0 volts and whose negative terminal, which is the automatically controlled potential, is connected to the terminal of the capacitor $C_0$, $C'_0$.

On the first control circuit side, an NPN bipolar transistor Q5 connects the terminal of the capacitor $C_0$ to a first pair of switches T1, T2. The collector of the transistor Q5 is thus connected to a junction point of the two switches, the other terminal of the switch T1 being connected to a first current mirror and the other terminal of the switch T2 being connected to a positive supply terminal. The emitter of the transistor Q5 is connected to the capacitor $C_0$. The base of the transistor Q5 is controlled by the output of the operational amplifier 71.

Similarly, a PNP transistor Q6 connects the terminal of the capacitor $C_0$ to a second pair of switches T3, T4. The collector of the transistor Q6 is thus connected to the junction point of the two switches, the other terminal of the switch T3 is connected to the ground potential and the other terminal of the switch T2 is connected to the second current mirror. The emitter of the transistor Q6 is connected to the capacitor $C_0$. The base of the transistor Q6, like that of the transistor Q5, is controlled by the output of the operational amplifier 71.

The two pairs of switches are controlled by the binary signal y(k) and its conjugate $y_b$(k). The switch T1 is controlled in the on state when the signal y(k) is at 1, the switch T2 is controlled in the on state when the signal $y_b$(k) is at 1, the switch T3 is controlled in the on state when the signal y(k) is at 1, and the switch T4 is controlled in the on state when the signal $y_b$(k) is at 1.

On the second control circuit side, an NPN bipolar transistor Q5' connects the terminal of the capacitor $C_0$ to a first pair of switches T1', T2'. The collector of the transistor Q5' is thus connected to a junction point of the two switches, the other terminal of the switch T1' being connected to a first current mirror and the other terminal of the switch T2' being connected to a positive supply terminal. The emitter of the transistor Q5' is connected to the capacitor $C_0$. The base of the transistor Q5' is controlled by the output of the operational amplifier 71'.

Similarly, a PNP transistor Q6' connects the terminal of the capacitor $C_0$ to a second pair of switches T3', T4'. The collector of the transistor Q6' is thus connected to the junction point of the two switches, the other terminal of the switch T3' is connected to the ground potential and the other terminal of the switch T2' is connected to the second current mirror. The emitter of the transistor Q6' is connected to the capacitor $C_0$. The base of the transistor Q6, like that of the transistor Q5', is controlled by the output of the operational amplifier 71'.

The first current mirror has for example two PMOS transistors whose gate is connected to the switches T1, T1' and whose source is connected to the positive supply terminal. The drain of one of the two transistors Q7 is connected to the switches T1, T1'. The second current mirror has for example two NMOS transistors whose gate is connected to the switches T3, T3' and whose source is connected to the ground potential. The drain of one of the two transistors Q9 is connected to the switches T3, T3'. The drain of the other transistor Q10 is connected to the drain of the transistor Q8 of the first current mirror. The junction point of these two transistors Q8, Q10 is connected to the input of the output filter $R_b$, $C_b$. This output filter is therefore charged by the output of the drains of the transistors Q8, Q10, namely by the output of the current mirror.

The two pairs of switches are controlled by the binary signal y(k) and its conjugate $y_b$(k) and in the same way.

When the capacitor $C_0$ gets charged at the current $I_0$, this current goes into the transistor Q6. The transistor Q5 is then turned off by the voltage Vbe of this transistor. Similarly, the transistor Q5' is on and the transistor Q6' is off because the capacitor $C'_0$ gets discharged. Two cases can then arise depending on whether the signal y(k) is in the 1 state or in the 0 state.

If this signal y(k) is at 1, the current Ic going through the transistor Q6 is shunted by the switch T3 to the ground potential and the current I'c going through the transistor Q5' is shunted by the transistor T1' from the transistors Q7, Q8 of the first current mirror. The two transistors Q7, Q8 controlled with the same gate source voltage then conduct the same current. To this end, the virtual ground potential $V_G$ enables the passage of the charging current Ic into the current mirror. Since the current Ic is imposed on the transistor Q7, the transistor Q8 also conducts this current. The current given by this transistor Q8 is the current $I_{ref}$ given to the output filter. It is positive and for example has a value $I_0$.

If the current y(k) is at 0, the current Ic going through the transistor Q6 is shunted by the transistor T4 to the second current mirror while the current I' c that flows into the transistor Q5' is shunted from the positive supply. The two transistors Q9, Q10 of the current mirror controlled by the same gate-source voltage conduct the same current with a value $I_0$. The output filter is then discharged by this current which flows into the drain of the transistor Q10. In this case, the charging current of the input filter $I_{ref}$ is negative, for example with a value of $-I_0$.

When the capacitor $C_0$ gets discharged at the current $I_0$, this current flows into the transistor Q5. The transistor Q6 is then turned off by the voltage Vbe of this transistor Q5. Similarly, the transistor Q6' is on and the transistor Q5' is off because the capacitor $C'_0$ gets charged. The same two cases as above can therefore occur.

If the signal y(k) is at 1, the current I'c flowing through the transistor Q6' is shunted by the switch T3' to the ground potential and the current Ic flowing through the transistor Q5 is shunted by the transistor T1 from the transistors Q7, Q8 of the first current mirror. The two transistors Q7, Q8 controlled with the same gate-source voltage then conduct the same current. Since the current Ic is imposed on the transistor Q7, the transistor Q8 also conducts this current. The current given by the transistor Q8 is the current $I_{ref}$ given to the output filter. It is positive and for example has a value $I_0$.

If the signal y(k) is at 0, the current Ic flowing through the transistor Q6' is shunted by the transistor T4' to the second current mirror while the current Ic that flows in the transistor Q5 is shunted from the positive supply. The two transistors Q9, Q10 of the current mirror controlled by the same gate-source voltage conduct the same current with a value 10. The output filter is then discharged by this current which flows into the drain of the transistor Q10. In this case, the current for the charging of the input filter $I_{ref}$ is negative, for example with a value of $-I_0$.

Thus, when the bit y(k) is at 1, the current $I_{ref}$ charges the input filter, whether the capacitors $C_0$, $C'_0$ get charged or discharged. Similarly, when the bit y(k) is at 0, the current in the output filter is $-I_{ref}$. The charging duration of the current $I_{ref}$ or $-I_{ref}$ in the filter is perfectly controlled by the charging or discharging duration of the capacitors $C_0$, $C'_0$.

The last two curves 86, 87 in FIG. 8 illustrate this result. A curve 86 gives an example of a sequence of values y(k)

and a curve 87 gives the current Is at output of the output filter of the converter as a function of the bits y(k). The time taken to control the charging and discharging of the capacitors $C_0$, $C'_0$ are such that there is for example at least one charging of the capacitor $C_0$ and one discharging of the capacitor $C'_0$ between the arrival of two successive bits y(k) at input of the converter. When a bit y(k) is at 1, there are then two successive positive current pulses 90, 91 at the output filter. Of these two pulses, the first corresponds to the current I'c for charging the capacitor $C'_0$ and the second to the current Ic for charging the capacitor $C_0$. When the bit y(k) is in the 0 state, there are two successive negative current pulses 92, 93 at the output filter. Of these two pulses, the first corresponds to the current Ic for charging the capacitor $C_0$ and the second to the current I'c for charging the capacitor $C'_0$.

The exemplary digital-analog converter illustrated in FIG. 7 has the advantage especially of having high efficiency as shown in FIG. 5 for the same reasons. It furthermore makes it possible to overcome the noise of the current sources $dI_{ref}$. This current noise induces a corresponding electric charging noise dQ which is given by the following relationship:

$$dQ = dI_{ref} T_{on} = \frac{2dI_{ref} C_0 V_0}{I_0} \quad (7)$$

according to the relationship (3) for the duration $T_{on}$ of two pulses. For the duration of one current pulse $I_{ref}$, the noise is given by:

$$dQ = \frac{dI_{ref} C_0 V_0}{I_0} \quad (8)$$

Furthermore, the electrical charge Q sent to the output filter during a pulse is perfectly controlled by what is called the clamp voltage $V_0$ and by what is called the clamp capacitance $C_0$. As is well known, it is equal to $C_0 V_0$. It follows therefore that dQ is zero. In fact, given that $dI_{ref}$ exists and that its value is not zero, the time $T_{on}$ or $T_{on}/2$ during which the current is sent gets adjusted as a function of the noise of the current $I_0$ since this time $T_{on}$ is precisely a function of $I_0$ as recalled above in the relationship (3).

In fact:

$$\frac{dV_0}{dt} = \frac{(I_0 + Ib_0)}{C_0} \quad (9)$$

where $Ib_0$ is the current noise superimposed on $I_0$. $T_{on}$ gets adjusted so that:

$$V_0 = \int_0^{T_{on}} \frac{(I_0 + Ib_0)}{C_0} dt \quad (10)$$

through the clamp circuit.

Given that $$Q = 2\int_0^{T_{on}} (I_0 + Ib_0) dt \quad (11)$$

It follows that
$Q = 2C_0 V_0$ and therefore that $dQ = 0$.

The switches may be bipolar transistors or MOS type transistors. Similarly, the other transistors used in the control circuit for the build-up time of the current may be bipolar or MOS type transistors. These transistors are NPN, PNP, NMOS, PMOS depending on the polarities in play according to the knowledge of those skilled in the art.

What is claimed is:

1. A digital-analog current converter having at least one binary input receiving a succession of bits that each have one or another of two binary states and at least one clock input receiving a clock signal, the digital-analog current converter being configured to provide a positive value or a negative value of output current on a converter output depending on the binary state of each of the succession of bits at the binary input, wherein the digital-analog current converter further comprises at least one time control circuit to control a time duration of the positive value and the negative value of the output current on the digital-analog current converter output, the at least one time control circuit comprising:

at least one timing capacitor; and at least one timing control circuit, the at least one timing control circuit including,
a first clock input receiving the clock signal, and
a charge output connected to the at least one timing capacitor,
wherein the at least one timing control circuit is configured to supply a first constant current from a first constant current source to the charge output to charge the at least one timing capacitor at a time determined by the clock signal, the charging of the at least one timing capacitor being terminated by the at least one timing control circuit when the charge on the at least one timing capacitor reaches a first reference voltage level.

2. The digital-analog current converter according to claim 1, wherein the at least one timing control circuit further comprises at least:

a switch configured to be controlled by the clock signal in such a way that the switch is on when the clock signal is in a first state and off when the clock signal is in a second state, the switch being connected between a power supply terminal and a terminal of the first constant current source, the other terminal of the first constant current source being connected to a ground potential terminal, with the at least one timing capacitor being wired between the charge output connected to a junction point between the switch and the first constant current source and the ground potential terminal, the first constant current flowing into the switch when the switch is open and into the charge output connected to the at least one timing capacitor when the switch is closed; and an operational amplifier having a positive input connected to receive the first reference voltage level and a negative input connected to an emitter of a transistor that is also connected to the junction point, the transistor further having a base connected to the output of the operational amplifier and a collector connected to the positive supply terminal, wherein when the voltage at the terminals of the at least one timing capacitor being charged reaches the first reference voltage level, the output of the operational amplifier controls the base of the transistor to place the transistor in an on state so that the first constant current is shunted by the transistor and the charging of the at least one timing capacitor cannot exceed a value determined by the first reference voltage level.

3. The digital-analog current converter according to claim 1, wherein the at least one timing control circuit is further configured to also control discharge of the at least one timing capacitor at constant current under control of the clock signal and a second reference voltage level, the at least one timing capacitor being discharged to a level determined by the second reference voltage level.

4. The digital-analog current converter according to claim 3, wherein the at least one timing control circuit further comprises:

at least one charge and discharge constant current supply circuit connected to a power supply terminal at a first side of the first constant current source delivering the first constant current that has a second side connected to a first side of a first switch that in turn has a second side connected to a first side of a second switch that in turn has a second side connected to a first side of a second constant current source delivering a second constant current that in turn has a second side connected to a second power supply terminal, the first switch being controlled by a first level of the clock signal and the second switch being controlled by a conjugate second level of the clock signal, the at least one timing capacitor being connected to the charge output and a discharge output of the at least one timing control circuit at a junction point between the first and second switches so that the at least one timing capacitor is charged by the first constant current and discharged by the second constant current from the corresponding one of first and second constant current sources;

at least one first limiting circuit configured to limit voltage at the terminals of the at least one timing capacitor to the first reference voltage level and at least one second limiting circuit configured to limit the voltage at the terminals of the at least one timing capacitor to a second reference voltage level, the at least one first limiting circuit comprising, a first operational amplifier, and a first transistor, wherein the first operational amplifier has a positive input receiving the first reference voltage level and a negative input connected to a collector of the first transistor that is connected to the junction point and an output connected to a base of the first transistor that further has an emitter connected to the second power supply terminal; the at least one second limiting circuit comprising, a second operational amplifier, and a second transistor, wherein the second operational amplifier has a positive input receiving the second reference voltage level and a negative input connected to an emitter of the second transistor that is connected to the junction point and an output connected to a base of the second transistor that further has a collector connected to the first power supply terminal, and wherein the first operational amplifier output at the base of the first transistor controls the first transistor to shunt the first constant current from the first constant current source when the voltage at the terminals of the at least one timing capacitor reaches the first reference voltage level and the second operational amplifier output at the base of the second transistor controls the second transistor to shunt the second constant current from the second constant current source when the voltage at the terminals of the at least one timing capacitor reaches the second reference voltage level.

5. The digital-analog current converter according to claim 4, comprising two arms in parallel, each arm comprising:

one of the charge and discharge constant current supply circuits;

a timing capacitor connected between the junction point of the first and second switches of the charge and discharge constant current supply circuit of each arm and an emitter of a third transistor connected to a collector of a fourth transistor;

a third operational amplifier having a positive input connected to a given potential and a negative input connected to a junction point between the third and fourth transistors and the timing capacitor, the output of the third operational amplifier controlling conduction of the third and fourth transistors;

a first current mirror connected with the two arms and a second current mirror connected with the two arms, the first and second current mirrors having a common output providing the output of the digital-analog current converter, with the first current mirror delivering the positive value of the output current and the second current mirror delivering the negative value of the output current;

a first pair of third and fourth switches having a common junction point connected to the third transistor, the third switch being connected by a second terminal to the first current mirror and the fourth switch being connected by a second terminal to a power supply terminal, the third and fourth switches being controlled by each input bit in such a way that the third switch is on when the input bit is in the binary 1 state and the fourth switch is on when the input binary bit is in the binary 0 state, the discharge current of the timing capacitor passing from a first transistor of the first current mirror to the timing capacitor through the third switch and the third transistor when the timing capacitor gets discharged, the discharge current being then present at the output of the first current mirror providing the digital-analog current converter output;

a second pair of fifth and sixth switches having a common junction point connected to the fourth transistor the sixth switch being connected by a second terminal to the second current mirror and the fifth switch being connected by a second terminal to a ground terminal, the fifth and sixth switches being controlled by each input binary bit so that the fifth switch is on when the bit is in the binary 1 state and the sixth switch is on when the input binary bit is in the binary 0 state, the charging current of the timing capacitor passing from a first transistor of the second current mirror to the timing capacitor through the sixth switch and the fourth transistor when the timing capacitor gets charged, the charging current being then present at output of the second current mirror providing the digital-analog current converter output;

wherein the two arms are controlled in phase opposition by the clock signal so that a timing capacitor associated with a first of the two arms is charged while another timing capacitor associated with a second of the two arms is discharged.

6. The digital-analog current converter according to claim 5, wherein the charge and discharge constant current supply circuits for each of the two arms have the same first and second constant current sources.

7. The digital-analog current converter according to any one of claims 1–6, wherein the output current from the digital-analog current converter is applied to a filter.

8. The digital-analog current converter according to any of claims 1–6, wherein the input succession of bits is given by a sigma-delta converter.

* * * * *